US007276219B2

(12) United States Patent
Meyer-Fredholm et al.

(10) Patent No.: US 7,276,219 B2
(45) Date of Patent: Oct. 2, 2007

(54) PREPARATION OF 157NM TRANSMITTING BARIUM FLUORIDE CRYSTALS WITH PERMEABLE GRAPHITE

(75) Inventors: Michele M. L. Meyer-Fredholm, Avon (FR); Michael A. Pell, Fountainebleau (FR)

(73) Assignee: Corning Incorporated, Corning, NY (US)

( * ) Notice: Subject to any disclaimer, the term of this patent is extended or adjusted under 35 U.S.C. 154(b) by 175 days.

(21) Appl. No.: 10/981,889

(22) Filed: Nov. 5, 2004

(65) Prior Publication Data

US 2005/0115490 A1    Jun. 2, 2005

Related U.S. Application Data

(62) Division of application No. 10/113,449, filed on Mar. 28, 2002, now Pat. No. 6,855,203.

(30) Foreign Application Priority Data

Mar. 29, 2001  (FR)  ................................. 01 044232

(51) Int. Cl.
    *C01B 33/26*  (2006.01)
    *C30B 13/02*  (2006.01)
    *C30B 13/04*  (2006.01)
(52) U.S. Cl. ....................... 423/328.2; 117/70; 117/81; 117/83
(58) Field of Classification Search .................. 117/70, 117/81, 83
    See application file for complete search history.

(56) References Cited

U.S. PATENT DOCUMENTS 6,669,778 B2 * 12/2003 Meyer-Fredholm .......... 117/83
6,782,075 B2 *  8/2004 Pell ............................. 378/73
6,894,284 B2 *  5/2005 Mayolet et al. ............. 250/372

\* cited by examiner

*Primary Examiner*—Felisa Hiteshew
(74) *Attorney, Agent, or Firm*—Walter M. Douglas

(57) ABSTRACT

The present invention is directed to a method of making large diameter metal fluoride sungle crystals that can be used in optical lithograpby systems, for example, excimer laser that operate below 200 nm. In addition, the invention is directed to metal fluoride single crystals suitable for use in such lithographic ststems, such fluoride crystals having a internal transmission of ≧99.9% at 193 nm and ≧99.0% at 157 nm.

6 Claims, 6 Drawing Sheets

VUV transmission curves from runs with High-Purity BaF2

FIG.2 – Heating schedule for BaF2 pretreatment

FIG 3- VUV Transmission Curves of Pretreated Raw Material

FIG.4 – Heating Cycle
Growth Process

FIG.5 – VUV transmission curves from runs with High-Purity BaF2

Transmission Measurement in Deep UV on BaF2 6-2 sample

PREPARATION OF 157NM TRANSMITTING BARIUM FLUORIDE CRYSTALS WITH PERMEABLE GRAPHITE

This application is a divisional application and claims the priority of U.S. application No. 10/113,449, filed Mar. 28, 2002, which is titled "PREPARATION OF 157NM TRANSMITTING BARIUM FLUORIDE CRYSTALS WITH PERMEABLE GRAPHITE"; and thus application further claims the priority and benefit of French Application No. 01 044232, filed Mar. 29, 2001 by M. Meyer-Fredholm and titled "Preparation of (mono)crystal".

BACKGROUND OF THE INVENTION

The present invention relates generally to the preparation of fluoride crystals, and particularly to making of barium fluoride crystals with improved below 175 nm wavelength optical properties.

More specifically, said invention relates:

to a process of preparing barium fluoride crystals, which is improved with reference to the purity of the crystals prepared with a permeable graphite crucible; and to a process of preparing barium fluoride crystals in permeable graphite crucibles with the resulting barium fluoride crystals having an increased transmission in the far-ultraviolet ($\lambda$<170 nm) at about the 157 nm wavelength of the fluorine excimer laser output.

TECHNICAL BACKGROUND

Ultra-high performance optical systems are required in order to increase the density of integration of the electronic components on a semi-conductor plate and insofar as exposed light of low wavelength (lower than 248 nm) is necessary in order to improve the resolution. The most common technique up to now for obtaining such optical systems uses fused silica. Ultra-high performance far-ultraviolet optical systems with below 175 nm wavelengths would benefit from highly transmitting barium fluoride optical crystals.

Slow progression by the semiconductor industry of the use of VUV light below 175 nm such as the 157 nm region light has been due to the lack of economically manufacturable high optically transmissive fluoride blanks and difficulties in manufacturing fluoride crystals which can be identified as high quality and qualified for their intended microlithography use. The present invention overcomes problems in the prior art and provides a means for economically providing high quality 157 nm transmitting fluoride crystal blanks for optical lithography lens element blanks that can be used to improve the manufacturing of integrated circuits with 157 nm vacuum ultraviolet wavelengths.

Said crystals comprised of barium fluoride are in principle obtained according to the process known as the Stockbarger-Bridgman process, which is familiar to the person skilled in the art. According to said process, the crystal is generated from a molten starting material crystal feedstock in slowly lowering (generally at a speed between 0.3 and 5 mm/h, more generally between 1 and 3 mm/h) a crucible (or a stack of crucibles) containing said molten material through a solidification zone which is provided in an oven. The crucible(s) is (are) made from a material which is resistant to chemical attack from the material that it contains. In general, it is (a) crucible(s) in graphite of high purity.

According to the teaching of U.S. Pat. Nos. 5,911,824 and 6,093,245, the graphite does have the drawback of being porous (of being a material having open porosity), and it is recommended to coat the internal walls of such graphite crucibles with an appropriate internal coating, in order to block the porosity of said walls. Carbon coatings, especially pyrolytic or vitreous carbon coatings, are described.

The crystals are preferably prepared in the absence of water, of air and of any other source of oxygen. They are thus generally prepared under vacuum in the presence of a fluorinating agent. Said fluorinating agent provides for the elimination of oxygen, especially of that introduced in the form of oxide as impurity in the starting material crystal feedstock. $PbF_2$ is the most utilised fluorinating agent, insofar as its manipulation does not present any particular difficulty, insofar as it is solid at ambient temperature and insofar as it has, itself and its corresponding oxide (PbO), a high vapour pressure at the temperatures of use of crystallisation ovens. Said $PbF_2$ acts, within the context of the preparation of $CaF_2$ crystals, notably according to the reaction:

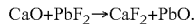

$$CaO + PbF_2 \rightarrow CaF_2 + PbO.$$

In practice, it is always delicate to optimise the intervention of said fluorinating agent. It is especially critical:

to adjust the rise in temperature of the mixture (for its melting) with the view to said optimisation;

to adjust the amount of said fluorinating agent, with the view to minimising any retention of Pb or other (according to the nature of said fluorinating agent in question) in the crystal prepared: such a retention has obviously disadvantageous repercussions on the performances of transmission and resistance to radiation of said crystal.

It is, within the context set forth above, with reference to the optimisation of the intervention of fluorinating agents, that the present invention has been developed.

SUMMARY OF THE INVENTION

One aspect of the invention relates to a process of preparing a barium fluoride optical crystal which includes loading a crucible with a mixture of a barium fluoride optical crystal starting material crystal, feedstock which contains at least one oxide as impurity, and an effective and non-excess amount of at least one fluorinating agent which is solid at ambient temperature, melting said mixture within said crucible, growing the barium fluoride crystal, by controlled cooling of the barium fluoride molten mixture, controlled cooling of said barium fluoride crystal to ambient temperature, and recovering said barium fluoride crystal wherein the oxide(s) resulting from the reaction between said fluorinating agent(s) and said oxide(s), the impurity or impurities, and the fluorinating agent components (particularly lead from lead fluoride) can be discharged from said crucible, in view of the crucible and the intrinsic permeability of the material constituting it.

In another embodiment, the present invention includes a method of making an optical barium fluoride crystal with increased below 170 nm transmission by providing a barium fluoride crystal producing permeable graphite crucible for containing the barium fluoride, said permeable graphite crucible comprised of a permeable graphite having a permeability of which, measured according to the DIN 51935 Standard, is greater than 4 $cm^2/s$, forming a molten barium fluoride melt in said graphite crucible comprised of said graphite having a permeability greater than 4 $cm^2/s$ and forming a barium fluoride crystal from said molten fluoride melt, said formed barium fluoride crystal having an increased far-ultraviolet transmission with intrinsic internal transmission at 157 nm≧99% per cm.

In another embodiment, the present invention includes an optical barium fluoride crystal producing graphite crucible for making an optical barium fluoride crystal with increased 157 nm transmission, said graphite crucible comprised of a graphite having a permeability of which, measured according to the DIN 51935 Standard, is greater than 4 cm$^2$/s, preferably the graphite has a permeability in the range of 5 to 15 cm$^2$/s.

In an embodiment the invention comprises a barium fluoride crystalline optical lithography lens element blank with 157 nm transmission above 99%/cm and preferably with large dimension diameters greater than 300 mm. The barium fluoride crystalline optical element blank includes crystalline subgrains which have crystalline subgrain structures. The barium fluoride crystalline optical element blank includes at least a first subgrain structure and a second subgrain structure. The second subgrain structure is adjacent to and abuts the first subgrain structure at a first defect boundary formed by dislocation defects. The first defect boundary has an adjacent first subgrain-second subgrain boundary angle. The first subgrain-second subgrain boundary angle is less than two minutes and the blank has an impurity level less than 0.2 ppm Pb by weight. The barium fluoride crystal has a 157 nm internal transmission of at least 99.2%/cm.

In a preferred embodiment the invention includes a method of making a barium fluoride crystalline optical lithography lens element blank. The method of making includes forming a barium fluoride crystalline melt from a barium fluoride feedstock with less than 150 ppm of oxygen in a machined crucible of permeable graphite, crystallizing the barium fluoride melt into a barium fluoride crystalline member preferably with a large dimension ≧200 mm, and annealing the fluoride crystalline member. The method further includes qualifying the annealed fluoride crystalline member to provide a fluoride crystalline optical lithography lens element blank with a 157 nm internal absorption coefficient less than 0.0022/cm and a maximum surface subgrain disorientation boundary angle ≦2 minutes.

Additional features and advantages of various embodiments of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

Figure 1:
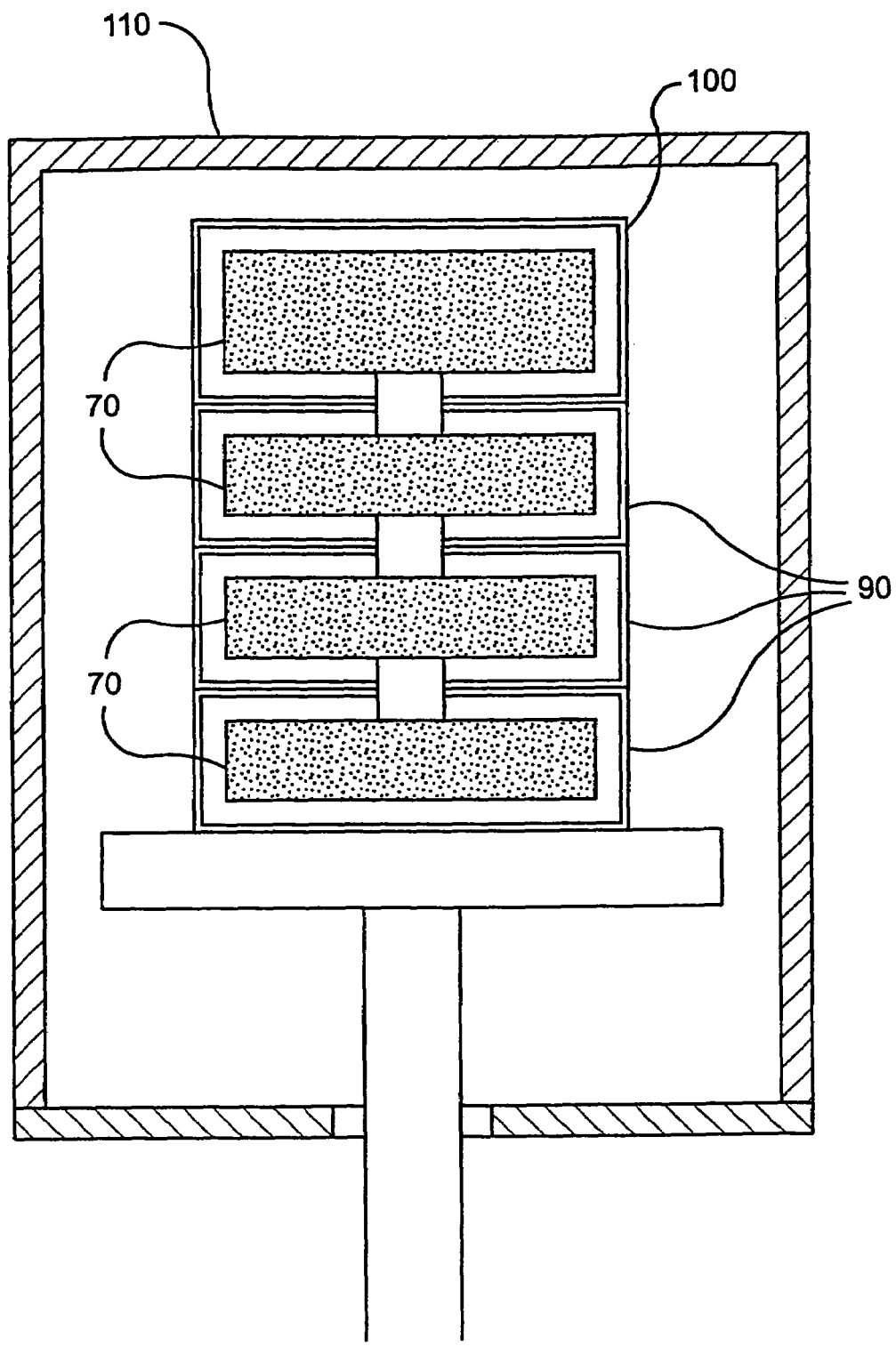
FIG. 1 shows an embodiment of the invention.

The process of preparing a crystal of the invention comprises:

loading a crucible with a mixture of the appropriate starting material crystal feedstock which contains at least one oxide as impurity, and an effective and non-excess amount of at least one fluorinating agent which is solid at ambient temperature, melting said mixture within said crucible, growing the crystal, by controlled cooling of the molten mixture, controlled cooling of said crystal to ambient temperature, and recovering said crystal.

In this, it can be a Stockbarger-Bridgman process, or any other equivalent process, each of the steps of which is familiar to the person skilled in the art, which is thus carried out in order to obtain a mono- or polycrystalline crystal.

Thus, in order to prepare (mono)crystals of CaF$_2$, said crucible is in general loaded with a mixture de synthetic CaF$_2$ powder, which contains CaO as impurity, and PbF$_2$ (fluorinating agent).

The crucible in question can very well not be a single one. The process of the invention can effectively be carried out, just as the process of the prior art, with a stack of n crucibles, which is moved with a translatory motion along its vertical axis.

The fluorinating agent(s) which is (are) incorporated is (are) not incorporated in an excess amount. In this way, it (they) cannot pollute the crystals prepared.

Characteristically, within the context of the invention, the oxide(s) (PbO, in the context specified above (in a purely illustrative manner) of preparation of (mono)crystals of CaF$_2$) resulting from the reaction between said fluorinating agent(s) (PbF$_2$) and said oxide(s), the impurity or impurities (CaO), can be discharged from said crucible, in view of the dimensions of said crucible and of the intrinsic permeability of the material constituting it.

The crucible(s) which intervene(s) for carrying out the process of the invention is (are) optimised, as to its (their) size and its (their) intrinsic permeability, such that the crystals prepared no longer contain—in any case, less than 0.1 ppm—any element corresponding to the formulation of the fluorinating agents (element Pb, in the context specified above (in a purely illustrative manner) of preparation of (mono)crystals of CaF$_2$, with intervention of PbF$_2$ as fluorinating agent).

Within the context of the process of the invention, the fluorinating agent (even the fluorinating agents) acts (act) and leave no trace. By virtue of its (their) controlled amount of intervention (effective and non-excess amount) and the original characteristics of the crucible employed, the fluorinating agent(s) react and the reaction products can discharge totally. There is thus no pollution of the crystals prepared.

In a non-obvious manner, within a context of optimisation of the intervention of the fluorinating agent(s), the inventors:

have demonstrated that the means of implementation of the temperature rise cycle (with the view to obtaining melting of the starting material crystal feedstock) did not constitute the determining factor of the purity (with reference to the fluorinating agent incorporated) of the crystals prepared;

have demonstrated that the purity of the material constituting the crucible was not directly responsible;

have clearly established a correlation between the intrinsic permeability of the crucible and the purity of the crystals prepared in said crucible. The more permeable the material constituting the crucible is, the less pollutant (introduced by the fluorinating agent(s) incorporated) is found in the crystals prepared. Obviously, the permeability of said crucible remains within a reasonable limit in order that the molten mixture be retained, in a stable manner, in said crucible.

The correlation established was, a priori, in no way obvious, and is entirely against the teaching of U.S. Pat. Nos. 5,911,824 and 6,093,245 set forth further up in the present text.

The permeability of a porous material (in this case of the crucibles used, which are in general graphite crucibles) is a parameter which is perfectly defined by the DIN 51935 Standard: 1993-08 (entitled "Determination of the coefficient of permeability by means of the vacuum—decay method with air as experimental gas"), which is familiar to the person skilled in the art. Said permeability, which is generally expressed in $cm^2/s$, is in fact the resultant of several factors which relate to the porosity, such as:

the size of the pores,
their distribution within the mass,
the fact that they unblock or not in a given proportion.

Characteristically, the process of the invention thus enables very pure crystals to be prepared (less than 0.1 ppm of contaminant in general, and especially less than 0.1 ppm of Pb when $PbF_2$ is used as fluorinating agent), insofar as the discharging of the impurities, which are generated following the intervention of the fluorinating agents, is mastered perfectly. The mastering of this discharging is based jointly on the dimensions of the crucible in question (said dimensions are inevitably limited such that the vapours have the possibility of diffusing (and of being discharged) within the molten material before its crystallisation (its solidification) and on the permeability of the material constituting said crucible. The vapours in question (PbO, in the context specified above (in a purely illustrative manner) of preparation of (mono)crystals of $CaF_2$, with intervention of $PbF_2$ as fluorinating agent) diffuse within the molten material and discharge through the permeable walls of the crucible and through the surface of said molten material.

Mention has been made of the intervention of an effective and non-excess amount of at least one fluorinating agent which is solid (at ambient temperature). In general, one sole such agent intervenes. It is however in no way excluded from the context of the invention that several of them intervene.

With reference to said effective and non-excess amount, it is indicated in a totally non-limiting way that said amount is rarely greater than 5% by weight of the starting material crystal feedstock which intervenes, that it is advantageously between 0.1 and 2% by weight of said starting material crystal feedstock.

With reference to the nature of said fluorinating agent(s), it is specified in the same way, i.e. in a totally non-limiting manner, that said fluorinating agent(s) is (are) selected from: $PbF_2$, $ZnF_2$, $NH_4F$, $NH_4F.HF$, PTFE (polytetrafluoroethylene: Teflon®), and mixtures thereof. It has already been seen, in the introduction of the present text, that $PbF_2$ is the most used fluorinating agent up to now. Its intervention is particularly recommended within the context of the present invention.

In a preferred alternative embodiment of the invention, the high permeability graphite crucible that are comprised of graphite having a DIN Standard (DIN 51935) greater than 4 $cm^2/s$ are utilized in conjunction with a gaseous fluorinating agent such as $CF_4$. Within the context of a preferred embodiment of the process of the invention, the crucible(s) which intervene(s) is (are) graphite crucible(s) the permeability of which, measured in accordance with the DIN Standard identified above (DIN 51935), is greater than 4 $cm^2/s$. Within the context of a particularly preferred variant, said crucible(s) is (are) in a graphite, the permeability of which, in accordance with the same Standard, is greater than 10 $cm^2/s$.

Generally, the intervention is recommended, in the process of the invention, of crucibles which are suitable for preparing crystals which have the following dimensions:
200 mm diameter, for 50 mm height,
300 mm diameter, for 80 mm height.

The intervention is particularly recommended of such graphite crucibles, the permeability of which is as indicated above.

The material constituting the crucibles used is not forced to be graphite, but, obviously, said material is adapted to the constraints of the process carried out within it (presence of corrosive products, high temperatures . . . ).

In any case, the pollutant oxide(s) generated during the crystallisation within the crystallisation crucible is (are), according to the invention, capable of being discharged from said crucible, by virtue of the dimensions of said crucible and the permeability of the material constituting it (them).

The process of the invention is particularly suitable for preparing (mono)crystals of alkali metal and/or alkaline-earth metal fluorides. It enables the preparation of (mono) crystals, which are very pure, of alkali metal or alkaline-earth metal fluorides, and even the preparation of mixed (mono)crystals of fluorides of alkali metals and/or alkaline-earth metals, which are very pure, (mixtures of at least two alkali metals, of at least two alkaline-earth metals or of at least one alkali metal and at least one alkaline-earth metal).

In accordance with the invention, (mono)crystals of fluorides have been prepared of high optical quality; especially (mono)crystals of calcium and barium fluorides which have, at the wavelengths ($\lambda$) indicated below, the intrinsic transmissions ($T_i$) specified below:
$\leq 193$ nm, $T_i \geq 99.9$ % and
$\leq 157$ nm, $T_i \geq 99.0$ %.

Such monocrystals have obvious potential in laser and lithography industries.

The process of the invention is more particularly suitable for preparing (mono)crystals of calcium fluoride ($CaF_2$).

The process of the invention is advantageously carried out with a stack of crucibles, according to the Stockbarger-Bridgman method, i.e. that in its context, the controlled cooling of the molten mixture (for growing the (mono) crystals) is obtained by very slowly moving a stack of loaded crucibles from the top to the bottom, from a hot zone to a cold zone, of an oven having a vertical axis.

The process of the invention is very advantageously carried out according to the improved Stockbarger-Bridgman method, as described in the French patent application FR 00 03 771 (24th Mar. 2000) not published as yet, i.e. with a translatory motion of the stack of loaded crucibles, continuously, the operations of loading of said crucibles being carried out without stopping the translatory motion (along the vertical axis) of the stack of crucibles.

Said process of the invention is classically carried out with starting material crystal feedstock in the form of a powder, especially a synthetic powder (e.g. $CaF_2$). It may also advantageously be carried out with starting material crystal feedstock which intervenes in the form of beads. Such alkali metal or alkaline-earth metal fluoride beads, their preparation and their use for preparing monocrystals are described in French patent application FR-A-2,799,194.

The person skilled in the art has understood perfectly that the presently claimed invention provides an advantage as regards the purity of the crystal prepared, that said crystal be obtained in a mono- or polycrystalline form.

The process of the invention is advantageously carried out for preparing (mono)crystals of calcium fluoride ($CaF_2$), in the presence of $PbF_2$ (fluorinating agent); said calcium fluoride (starting material crystal feedstock) containing calcium oxide (CaO) as impurity.

Alternatively the process of the invention is advantageously carried out for preparing (mono)crystals of calcium fluoride ($CaF_2$), in the presence of $CF_4$ (gaseous fluorinating agent); said calcium fluoride (starting material crystal feedstock) containing calcium oxide (CaO) as impurity.

This advantageous variant of implementation of the process of the invention is illustrated by the following Examples.

EXAMPLE I

The Stockbarger-Bridgman process was carried out, starting with synthetic $CaF_2$ powder, under the same conditions, in using graphite crucibles (stacks of such crucibles); the graphites (type A to D) not having the same characteristics. The characteristics in question—density, porosity, average pore diameter, Permeability—are indicated in Table I below.

The crucibles used had the same geometry (cylindrical) and the same dimensions: 200 mm diameter for 50 mm height.

The process of the invention was carried out with crucibles in graphite of type C and D.

Upon completion of the implementation of the process, the crystals obtained were analysed chemically with the view to determining their lead (Pb) content.

Said lead content is indicated in said Table I below (last line).

The presence of lead, within the crystals prepared in the crucibles in graphite of type A and B, was further confirmed by examination of the absorption band at 205 nm. In the same way, the <<absence>> of lead (the absence of said absorption band) within the crystals prepared in the crucibles in graphite of type C and D was confirmed.

It emerges without ambiguity from the consideration of the values indicated in said Table I that the more the graphite is permeable, the lower the residual lead content is. The crystals obtained in the crucibles in graphite of type A and B are not acceptable (due to their residual lead content, which is too high).

These results were not foreseeable in the light of the prior art teaching.

Thus, the inventors have themselves carried out considerable experimental work before identifying the critical parameter—the intrinsic permeability of the material constituting the crucible, the dimensions of said crucible being fixed—. The inventors have especially demonstrated that the means of implementation of the heating cycle (with the view to obtaining the melting of the starting material crystal feedstock) was not itself critical. This is the subject of the Comparative Example below.

TABLE I

| | Graphite | | | |
|---|---|---|---|---|
| | A | B | C | D |
| Density (g/cm$^3$) | 1.745 | 1.723 | 1.704 | 1.590 |
| Porosity (Hg) (%) | 15.8 | 16.1 | 16.7 | 22.6 |
| Average pore diameter (μm) | 2.2 | 19.1 | 6 | 21 |
| Permeability (cm$^2$/s) | 0.13 | 2.6 | 4.6 | 14.7 |
| Pb content (ppm) | 1,000 to 1,500 | 5 to 20 | <0.2* | <0.2* |

*below the limit of detection.

EXAMPLE II

Graphite crucibles, having the dimensions indicated in Example I, of type A and C were used (in stacks) to prepare crystals according to the Stockbarger-Bridgman method. Said method was carried out with different temperature rise cycles which are specified in Table II below.

It is seen that the results, in terms of pollution (lead content of the crystals prepared), are not linked to the means of implementation of the heating, but only to the nature of the graphite constituting the crystallisation crucibles.

Preferably the increased far-ultraviolet transmission fluoride optical crystal producing graphite crucible is comprised of a graphite having a permeability of which, measured according to the DIN 51935 Standard, is greater than 4 cm$^2$/s. Preferably the graphite permeability is greater than 5 cm$^2$/s, more preferably greater than 6 cm$^2$/s, more preferably greater than 7 cm$^2$/s, more preferably greater than 8 cm$^2$/s, more preferably greater than 9 cm$^2$/s, more preferably greater than 10 cm$^2$/s, more preferably greater than 11 cm$^2$/s, more preferably greater than 12 cm$^2$/s, more preferably greater than 13 cm$^2$/s, more preferably greater than 14 cm$^2$/s. Preferably the increased far-ultraviolet transmission fluoride optical crystal producing graphite crucible is comprised of a graphite having a Hg porosity of at least 16.7%, more preferably at least 17%, more preferably at least 18%, more preferably at least 19%, and more preferably a Hg porosity of at least 20%.

TABLE II

| | ① (low temperature) | ② (high temperature) |
|---|---|---|
| Temperature rise cycle | 0 to 600° C., at 50° C./h<br>600 to 800° C., at 10° C./h<br>800° C., for 12 h<br>800 to 1,100° C., at 20° C./h<br>1,100 to 1,520° C., at 50° C./h | 0 to 850° C., at 50° C./h<br>850 to 1200° C., at 30° C./h<br>1,200° C., for 12 h<br>1,200° C. to 1,520° C., at 50° C./h |
| Graphite A | Presence of lead | Presence of lead |
| Graphite C | No lead | No lead |

Optical fluoride crystals comprised of barium fluoride are of interest for use in potential 157 nm lithography and laser systems. Barium Fluoride crystals are attractive materials for 157 nm photolithography. The interest in $BaF_2$ optical fluoride crystals stems from two possible functions in the stepper system. The first is for correction of chromatic aberration (color correction) and the second is correction of intrinsic birefringence. In a further aspect optical fluoride crystals comprised of barium fluoride are of interest is that mixed optical fluoride crystals including barium fluoride provide the potential of avoiding intrinsic birefringence at 157 nm, such as with a mixed optical fluoride crystal including barium fluoride and calcium fluoride.

Chromatic aberration arises from the dependence on wavelength of the refractive index in a given material. Excimer laser sources have a finite bandwidth (about 1 pm at 157 nm), and therefore each component of the bandwidth "sees" a different refractive index. In refractive systems this leads to defocusing of the image on the wafer. One can correct for this by introducing a second material with a different dispersion than the first. At 193 nm color correction is achieved by matching the dispersion of $CaF_2$ and fused silica. $BaF_2$ is the likeliest alternative for a second material at 157 nm as it shares many of the attributes of $CaF_2$: it has a band edge below 140 nm, it has cubic symmetry, it is stable, can be polished, and can be grown in large size (Table Dispersion of alkaline-earth fluorides).

TABLE

Dispersion of alkaline-earth fluorides

| Material | Absolute Index (157.6299 nm)(ave) | dn/dT (near 20° C.) (° C.$^{-1}$) | Dispersion dn/dλ (nm$^{-1}$) | Dispersion (from $CaF_2$) |
|---|---|---|---|---|
| $CaF_2$ | 1.559270 (±6 × 10$^{-6}$) (20.00° C.) | 6.1 × 10$^{-6}$/° C. (vac) (±0.3 × 10$^{-6}$/° C.) | −0.002605 nm$^{-1}$ range: ±5 × 10$^{-6}$ | 0 |
| $SrF_2$ | 1.575583 (±6 × 10$^{-6}$) (20.00° C.) | 3.9 × 10$^{-6}$/° C. (vac) (±1.5 × 10$^{-6}$/° C.) | −0.003056 nm$^{-1}$ (±4 × 10$^{-6}$ nm$^{-1}$) | ~+17.3% |
| $BaF_2$ | 1.656690 (±6 × 10$^{-6}$) (20.00° C.) | 8.6 × 10$^{-6}$/° C. (vac) (±0.5 × 10$^{-6}$/° C.) | −0.004376 nm$^{-1}$ (±4 × 10$^{-6}$ nm$^{-1}$) | ~+68.0% |

Intrinsic birefringence in $CaF_2$ at 157 nm was brought to light after researchers at NIST demonstrated that the effect could be significant. In $CaF_2$ the $\Delta n_{<-110>,-<001>}$ is $-18\times10^{-7}$ at 157 nm. For $BaF_2$, the $\Delta n$ is $+52\times10^{-7}$. The fact that the $\Delta n$ for $CaF_2$ and $BaF_2$ are of opposite sign suggests that one could arrive at a system with $\Delta n=0$ by mixing crystals of the two materials.

Crystals were grown in Stockbarger-Bridgeman crystal vacuum furnaces, an example of which is shown in FIG. 1 which can grow crystals up to 320 mm×50 mm. Stockbarger-Bridgeman crystal vacuum furnaces were used for pretreatment of raw materials in batches up to 40 kg. Stockbarger-Bridgeman crystal vacuum furnaces were used to grow 64 mm rods for raw materials testing.

The invention provides $BaF_2$ crystals with diameter of >300 mm grown with 157 nm transmission above 99 %/cm.

Elemental analyses of BaF2 Raw Materials are shown in Table I—Analysis of BaF2 Raw Materials. A preferred BaF2 raw material contains less than 150 ppm oxygen, preferably less than 120 ppm oxygen. Oxygen content in the material A is estimated at greater than 2000 ppm.

TABLE I

Analysis of BaF2 Raw Materials

| | A-high O | B-high O | C-high O | D-low O |
|---|---|---|---|---|
| Li | 1.1 | 0.3 | 0.03 | 0.03 |
| Na | 1.4 | 0.8 | <0.01 | <0.01 |
| K | 2.5 | 0.9 | | |
| Rb | | | | |
| Cs | | | | |
| Mg | 1 | <0.2 | 0.01 | 0.01 |
| Ca | 6 | | 0.6 | 0.6 |
| Sr | 18.4 | 13.4 | 10 | 10 |
| Al | | <0.2 | 0.2 | 0.2 |
| Si | | | | |
| Ge | | | | |
| Tl | | | <0.01 | <0.01 |
| Pb | 1.6 | <0.2 | 0.01 | 0.01 |
| Sc | <0.2 | <0.2 | | |
| Y | <0.2 | <0.2 | <0.1 | <0.1 |
| Ti | | | | |
| V | 0.3 | <0.2 | | |
| Cr | <0.2 | <0.2 | <0.01 | <0.01 |
| Mn | 0.2 | <0.2 | <0.01 | <0.01 |
| Fe | 3.4 | <0.2 | <0.1 | <0.1 |
| Co | <0.2 | <0.2 | <0.01 | <0.01 |
| Ni | 0.6 | <0.2 | <0.01 | <0.01 |
| Cu | <0.2 | <0.2 | <0.01 | <0.01 |
| Zn | | | <0.1 | <0.1 |
| Mo | | | <0.01 | <0.01 |
| Cd | | | <0.01 | <0.01 |
| La | 0.2 | <0.2 | <0.1 | <0.1 |
| Ce | | <0.2 | <0.01 | <0.01 |
| Yb | <0.2 | <0.2 | | |
| Gd | <0.2 | <0.2 | | |
| Tb | 0.4 | <0.2 | <0.01 | <0.01 |
| H2O 900° | | | | |
| H2O 300° | | 0.21% | | |
| NH4 | | 0.06% | | |
| O(LECO) | | 1760 | 1800 | <150 |

Crystals were grown in stacked graphite crucibles with the top crucible covered by a graphite plate. The entire stack was housed in a graphite container. Two types of graphite were used. Low permeable graphite (less than 4 cm$^2$/s) was used for runs 1 through 3. Machined permeable graphite crucibles were used for runs 4 through 8.

It should be noted here that the melting point of BaF2 is about 1368° C.; about 50° C. lower than that of CaF2.

Figure 2:
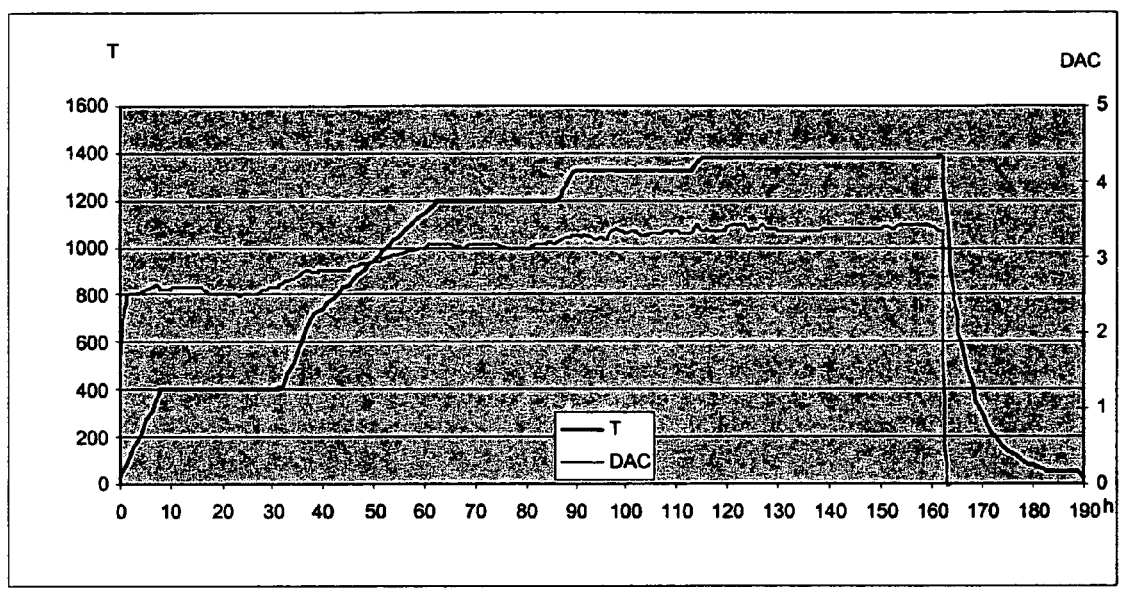
FIG. 2 shows an embodiment of the invention.
Figure 3:
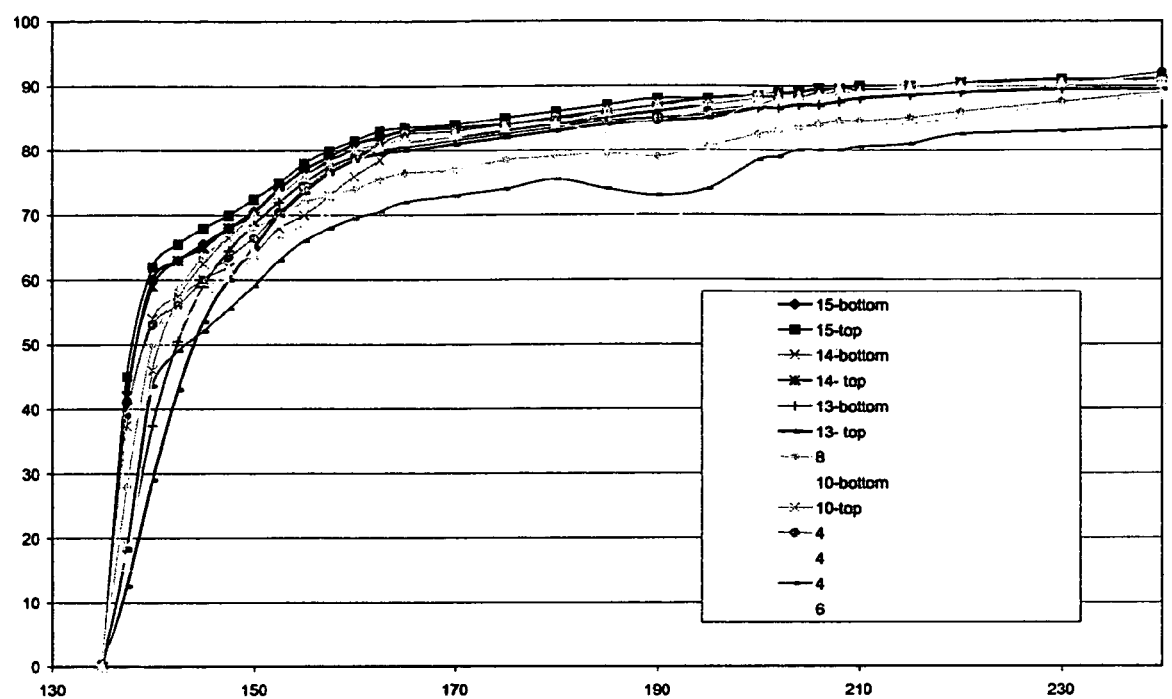
FIG. 3 shows an embodiment of the invention.

Pretreatment—Raw material pretreatment was carried out in 40 kg batches in a Stockbarger-Bridgeman crystal vacuum furnace. The raw material were mixed with 3 wt. % PbF2 and loaded into stacked graphite crucibles. The heating profile is shown in FIG. 2. Subsequent to pretreatment, 6 mm transmission samples are evaluated on a VUV spectrophotometer. Transmission spectra are shown in FIG. 3. Note that only runs 6,7,10, 14, and 15 used virgin raw material. Pretreated densified purified barium fluoride crystal feedstock preferably has a 145 nm transmission >50%.

Figure 4:
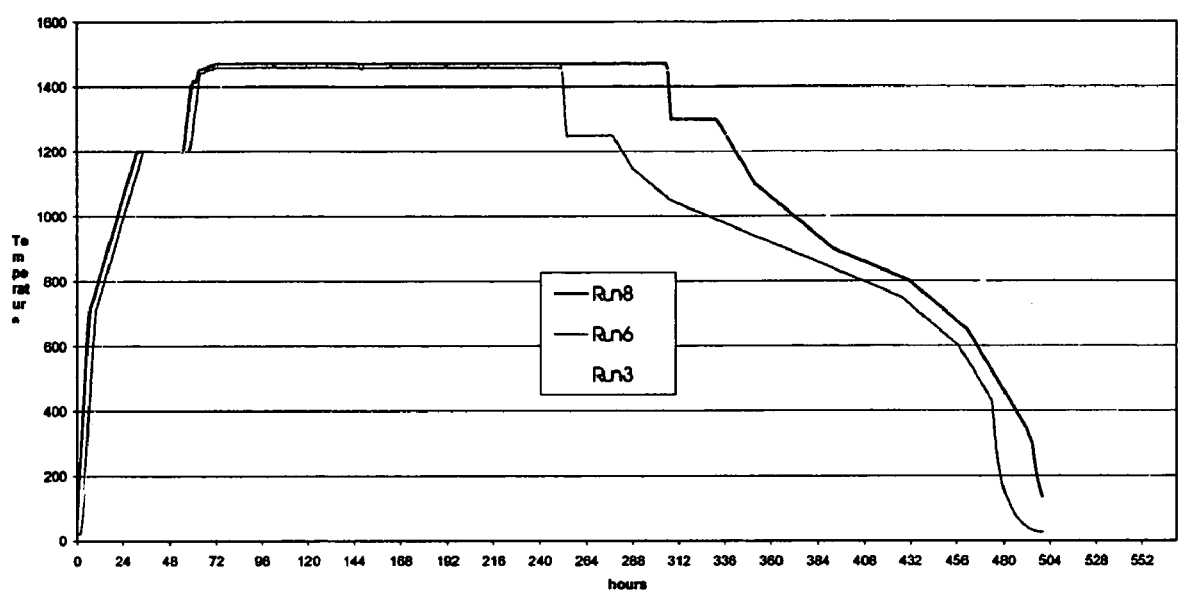
FIG. 4 shows an embodiment of the invention.

Crystal growth—Ten runs were performed and are summarized in Table 3. Of these, three ended in failure. The first three runs served for furnace debugging and were performed using low grade raw material A. Latter three runs (Run-3, Run-6 [6-1, 6-2], Run-8) will be discussed. The heating cycles of these runs is shown in FIG. 4. The furnace charge, and PbF2 content may be found in Table 3.

Figure 5:
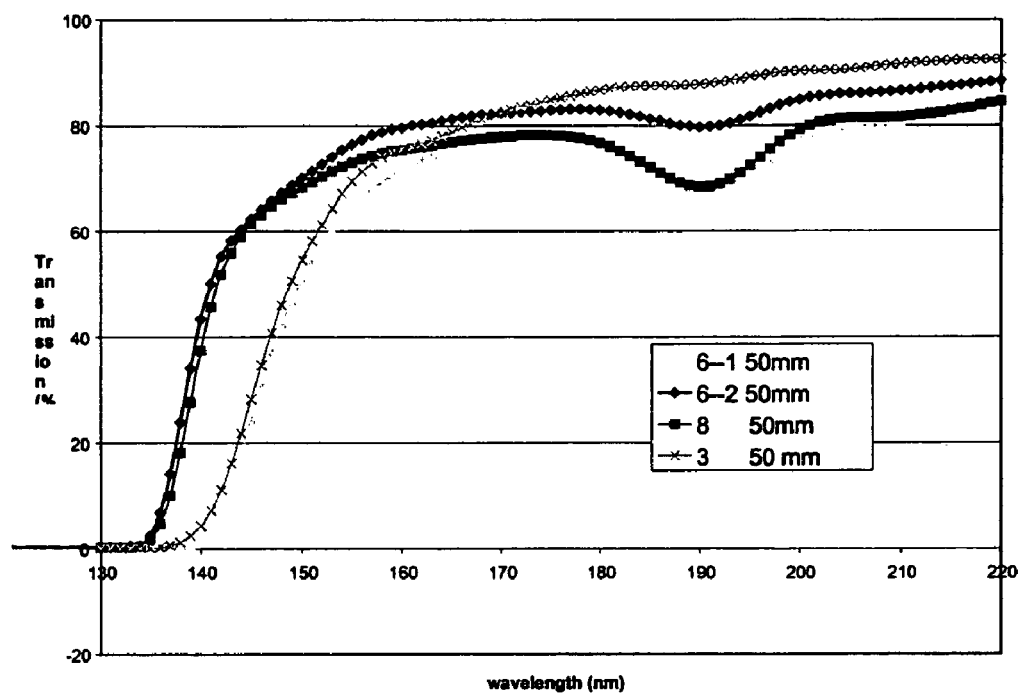
FIG. 5 shows an embodiment of the invention.
Figure 6:
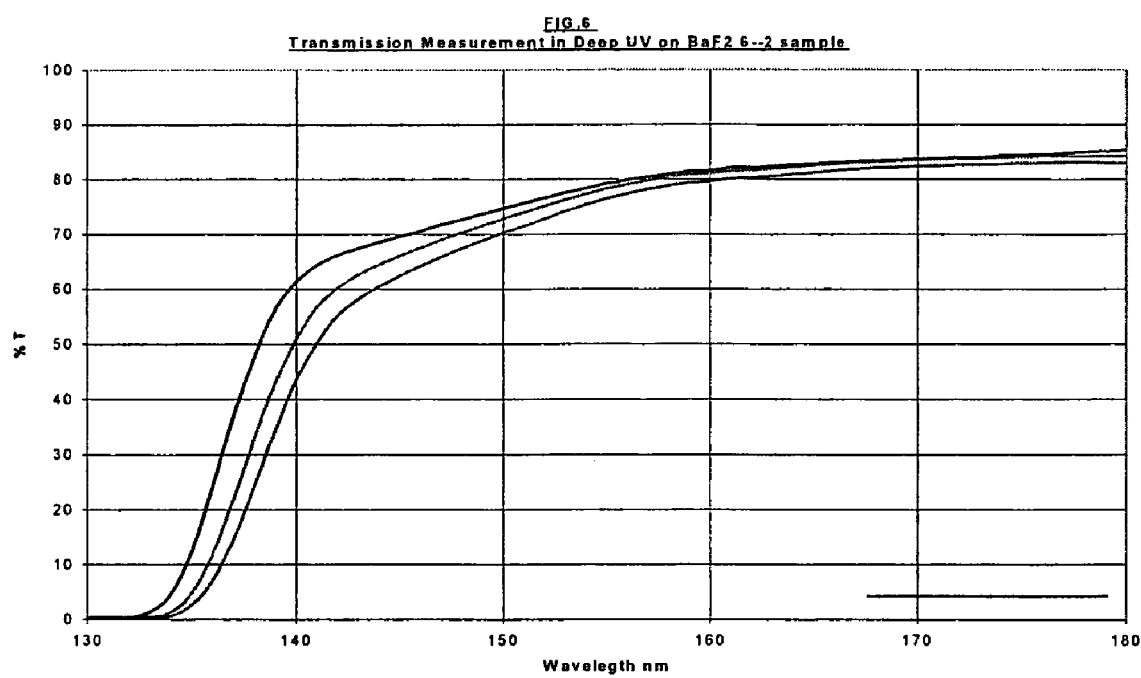
FIG. 6 illustrates the deep UV transmision of BaF$_2$ sample No. 6-2 that is described in Table 3.

In FIG. 5 we show the VUV spectrum of 50 mm crystals from runs 3, 6, and 8. The 157 nm internal transmission values calculated from MPL sets are given in Table 4.

TABLE 3

SUMMARY OF CRYSTAL GROWTH.

| Run | PbF$_2$ Added (wt. %) | Raw material, Kg | Time to reach melting point (Hours) | T | Permeable Graphite Crucible | $T_{int}$ at 157 nm %/cm | Furnace |
|---|---|---|---|---|---|---|---|
| 1 | 0.3 | A 85.4 | 76 | 1440 hold 24 hours | NO | | |
| 2 | 0.5 | A 83.1 | 76 | 1455 hold 24 hours | NO | | |
| 2a | 0.5 | A 64.4 | 85 | 1450 hold 24 hours | NO | | |
| 3 | 0.2 | D 52 | 85 | 1450 hold 24 hours | NO | 96.9 | |
| 4 | 0.2 | D 35.6 | | 1323 fast cooling | YES | | Failure |
| 4a | 0.2 | A 31.3 | 85 | 1450 hold 48 hours | YES | | |
| 5 | 0.2 | D 37.4 | 85 | 1440 hold 3 hours fast cooling | YES | | Failure |
| 6--1 | 0.2 | D 31.3 | 66 | 1460 hot soak 48 hours | YES | 96.4 | |
| 6--2 | 0.2 | D 31.3 | 66 | 1460 hot soak 48 hours | YES | 99.3 | |
| 7 | 0.2 | D 61.7 | 66 | 1475 hot soak 48 hours fast cooling | YES | | |
| 8 | 0.2 | D 59.8 | 66 | 1470 hold 48 hours fast cooling fast cooling | YES | 98.3 | |

TABLE 157 nm Internal Transmission

| Crystal | $T_{int}$ 157 nm | $R^2$ of fit |
|---|---|---|
| 3 | 96.9%/cm | 0.977 |
| 6--1 | 96.4%/cm | 0.994 |
| 6--2 | 99.3%/cm | 0.942 |
| 8 | 98.3%/cm | 0.984 |

There is no absorption peak visible at 193 nm. This indicated that Pb has been effectively removed from the crystals. The Pb content of these crystals is <10 ppb based on absorption coefficient of Pb in BaF2 (0.0003 cm$^{-1}$/ppb). The variable position of the band edge should also be noted. It can be seen in FIG. 5 that the band edge can shift up to 10 nm in BaF2.

The invention provides for the growth of BaF2 crystals with 157 nm internal transmission >99 %/cm. The result obtained is especially interesting owing to the very large crystal size (320 mm). PbF2 fluorinating agent was used, and the invention provides for obtaining high required 157 nm transmission in optical fluoride crystals using Pb-based fluorinating agent technology. This is underscored by the lower melting point of BaF2 with respect to CaF2. The volatility of PbF2 is lower during BaF2 crystal growth conditions. The absence of Pb in the resulting crystals shows the benefit of using permeable graphite in the growth of optical fluoride crystals.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

The invention claimed is:

1. A lithography excimer laser optical element blank optical fluoride crystal with increased far-ultraviolet transmission, said optical fluoride crystal including barium fluoride, said optical fluoride crystal including barium fluoride formed from a molten optical fluoride melt including barium fluoride, said optical fluoride crystal including barium fluoride having an increased far-ultraviolet transmission with an internal transmission at 157 mm $\geqq$99.3%/cm; and said optical fluoride crystal having a plurality of crystalline subgrains, each of said subgrains having a crystalline subgrain structure, said optical fluoride crystal including at least a first subgrain structure and a second subgrain structure, said second subgrain structure adjacent and abutting said first subgrain structure at a first defect boundary formed by a plurality of dislocation defects, said boundary dislocation defects having an adjacent first subgrain-second subgrain boundary angle, said first subgrain-second subgrain boundary angle less than two minutes.

2. A lithography excimer laser optical element blank optical fluoride crystal with increased far-ultraviolet transmission as claimed in claim 1, said optical fluoride crystal including barium fluoride with internal transmission at 157 nm $\geqq$99.3%/cm having a 145 nm transmission >60%.

3. A barium fluoride optical fluoride crystal with increased far-ultraviolet transmission, said barium fluoride crystal having an increased far-ultraviolet transmission with an internal transmission at 157 nm$\geq$99.30/cm and a 145 nm transmission >60%.

4. A barium fluoride optical fluoride crystal as claimed in claim 3 having a plurality of crystalline subgrains, each of said subgrains having a crystalline subgrain structure, said fluoride crystalline blank including at least a first subgrain structure and a second subgrain structure, said second subgrain structure adjacent and abutting said first subgrain structure at a first defect boundary farmed by a plurality of dislocation defects, said boundary dislocation defects having an adjacent first subgrain-second subgrain boundary angle, said first subgrain-second subgrain boundary angle less than two minutes.

5. A metal fluoride optical crystal suitable making optical elements for excimer laser use, said crystal is a barium fluoride crystal having an intrinsic transmission $T_i \geq 99.9\%$ at a wavelengths $\leq$193 nm and an intrinsic transmission $T_i \geq 99.0\%$ at a wavelengths $\leq$157 nm, and wherein said barium fluoride has an internal transmission at 157 nm$\geq$99.3/cm having a 145 nm transmission >60%.

6. The metal fluoride crystal according to claim 5, wherein said crystal is comprised of a plurality of crystalline subgrains, each of said subgrains having a crystalline subgrain structure, said crystal including at least a first subgrain structure and a second subgrain structure, said second subgrain structure being adjacent and abutting said first subgrain structure at a first defect boundary fanned by a plurality of dislocation defects, said boundary dislocation defects having an adjacent first subgrain-second subgrain boundary angle, said first subgrain-second subgrain boundary angle being less than two minutes.

* * * * *

UNITED STATES PATENT AND TRADEMARK OFFICE
CERTIFICATE OF CORRECTION

PATENT NO. : 7,276,219 B2  Page 1 of 1
APPLICATION NO. : 10/981889
DATED : October 2, 2007
INVENTOR(S) : Michele Marie-Louise Meyer-Fredholm et al.

It is certified that error appears in the above-identified patent and that said Letters Patent is hereby corrected as shown below:

| Col. | Line | Description |
|------|------|-------------|
| 12 | 48 | Reads "internal transmission at 157mm ≥ 99.3%/cm; and" should read --internal transmission at 157 nm ≥ 99.3%/cm; and-- |
| 13 | 10 | Reads "structure at a first defect boundary farmed by a plurality of" should read --structure at a first defect boundary formed by a plurality of-- |
| 14 | 11 | Reads "grain structure at a first defect boundary fanned by a" should read --grain structure at a first defect boundary formed by a-- |

Signed and Sealed this

Twenty-sixth Day of February, 2008

JON W. DUDAS
*Director of the United States Patent and Trademark Office*